United States Patent
Teague et al.

(10) Patent No.: US 11,552,203 B2
(45) Date of Patent: Jan. 10, 2023

(54) PHOTOCONDUCTIVE SEMICONDUCTOR SWITCH ASSEMBLY UTILIZING A RESONANT CAVITY

(71) Applicant: Government of the United States, as represented by the Secretary of the Air Force, Wright-Patterson, OH (US)

(72) Inventors: Joseph D. Teague, Tijeras, NM (US); Katherine A. Sheets, Englewood, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/136,516

(22) Filed: Dec. 29, 2020

(65) Prior Publication Data

US 2022/0209028 A1 Jun. 30, 2022

(51) Int. Cl.
*H01L 31/0232* (2014.01)
*H01L 31/09* (2006.01)
(Continued)

(52) U.S. Cl.
CPC .......... *H01L 31/02325* (2013.01); *C30B 7/10* (2013.01); *H01L 31/09* (2013.01); *H01L 51/5265* (2013.01)

(58) Field of Classification Search
CPC ............... H01L 31/02325; H01L 31/09; H01L 51/5265; H01L 51/447
(Continued)

(56) References Cited

U.S. PATENT DOCUMENTS 7,335,922 B2 * 2/2008 Plaine ............... H01L 27/15
257/E33.059
2007/0158638 A1 * 7/2007 Perera ............ H01L 31/035236
257/13
(Continued)

OTHER PUBLICATIONS

Wu, Q., Initial Test of Optoelectronic High Power Microwave Generation From 6H-SiC Photoconductive Switch, IEEE Electron Device Letters, vol. 40, No. 7, Jul. 2019.
(Continued)

*Primary Examiner* — Calvin Y Choi
(74) *Attorney, Agent, or Firm* — AFMCLO/JAZ; Timothy M. Barlow

(57) ABSTRACT

A PCSS comprises a photoconductive semiconductor block that exhibits electrically-conductive behavior when exposed to light of a predetermined wavelength; two or more electrodes fixed to the photoconductive semiconductor block and connectable to a power supply; a resonance cavity enveloping the photoconductive semiconductor block, the resonance cavity having a reflective outer surface to trap light within the resonance cavity and the photoconductive semiconductor block, the resonance cavity having a window through the reflective outer surface to admit light of the predetermined wavelength, the resonance cavity being transmissive to light of the predetermined wavelength within the reflective outer surface; and a light source directed toward the photoconductive semiconductor block and through the window, and emitting light at the predetermined wavelength. The photoconductive semiconductor block may include Si, GaAs, GaN, AlN, SiC, and/or $Ga_2O_3$. The resonance cavity may include glass, crystal, Au, Ag, Cr, Ni, V, Pd, Pt, Ir, Rh, and/or Al.

2 Claims, 5 Drawing Sheets

(51) Int. Cl.
  *H01L 51/52* (2006.01)
  *C30B 7/10* (2006.01)
(58) Field of Classification Search
  USPC .......................................................... 257/432
  See application file for complete search history.

(56) References Cited

U.S. PATENT DOCUMENTS

2008/0210893 A1* 9/2008 McCarthy ............. G02F 1/0147
                                                                                        359/359
2019/0131482 A1* 5/2019 Conway ................. H03K 17/78

OTHER PUBLICATIONS

Pocha, M.D. et al., Photoconductive Switching for HPM Generation, Fifth National Conference on High Power Microwave Technology, Westpoint, New York, Jun. 10, 15, 1990.
Sullivan, J.S., Wide Bandgap Extrinsic Photoconductive Switches, National Security Engineering Division Lawrence Livermore National Laboratory, 2013.
Taylor, Z.D., Resonant-optical-cavity photoconductive switch with 0.5% conversion efficiency and 1.0W peak power, Jun. 1, 2006 / vol. 31, No. 11 / Optics Letters.

* cited by examiner

PHOTOCONDUCTIVE SEMICONDUCTOR SWITCH ASSEMBLY UTILIZING A RESONANT CAVITY

RIGHTS OF THE GOVERNMENT

The invention described herein may be manufactured and used by or for the Government of the United States for all governmental purposes without the payment of any royalty.

FIELD OF THE INVENTION

The present invention relates generally to photoconductive semiconductor switches and, more particularly, to a photoconductive semiconductor switch utilizing total internal reflection.

BACKGROUND OF THE INVENTION

The energy demands of an increasingly electrified world have caused a renewed interest in once dormant fields of research. Photoconductive Semiconductor switches (PCSS) are one of these fields. They theoretically offer high voltage, high current switching in sub $cm^3$ packaging, without the shot to shot variation and bulk of current high-power DC switches such as spark gaps. PCSS are capable of power densities of $10^9$-$10^{10}$ W/$cm^3$, with electric fields ranging from $10^5$-$10^6$ V/cm and current densities from $10^4$-$10^6$ A/$cm^2$.

Most PCSS make a trade-off between voltage, current, and durability, which make them unsuitable for applications which require all three. GaN PCSS appear to offer the most potential, combining high hold-off voltages with high repetition rates and current handling capability.

PCSS are optically triggered switches capable of rise times less than 300 ps and switch frequencies ranging from Hz to MHz. The prospect of a small, high frequency, high power solid-state switch allows for a design space that complements and potentially replaces spark gaps and high-power IGBTs. The combination of high power and high-frequency makes these switches of interest to both the pulsed power community and DC/DC converter community as they allow for more space and energy-efficient high power converters and pulsed power sources.

High voltage PCSS are being actively pursued are wide-bandgap semiconductors, such as SiC, GaAs, or GaN which are made to be semi-insulating through the addition of impurities, such as vanadium, magnesium, iron, or others. These impurities then form deep acceptors sites within the material. When photons of sufficient energy impact the material, the material becomes conductive due to the excitation of electrons trapped in the deep acceptors into the conduction band. As a result, the device performs analogous to a switch, going from an insulated "off" state, to a conductive "on" state.

These PCSS operate in two separate modes known as "linear" and "nonlinear" (also known as high-gain or "lock-on"). The linear mode is so called because current is directly proportional to optical energy, i.e. each photon generates one electron-hole pair in the device. Any semiconductor will exhibit linear photoconductivity when stimulated at the correct wavelength. The downside to this linear mode is that the optical trigger energies required for switch operation reduce system efficiency and greatly increase overall system footprint. A less common mode, to date only observed in GaAs and InP, is the high-gain mode, where the device stays conductive beyond the duration of the light pulse and remains so until the electric field across the device drops below a material and light energy dependent threshold.

Varieties of PCSS and Their Pros/Cons

SiC in the linear mode has had substantial research conducted and is better understood and characterized than other PCSS materials. It also has the best thermal conductivity of the materials commonly studied (beneficial for steady-state operation and cooling) and matches well with existing laser trigger sources. When tested with an ND:Yag laser at 532 and 1064 nm, it exhibited relatively low on-state resistances of 2-3Ω and 11Ω respectively for 6H—SiC across a 400 micron gap. However, due to its lower drift velocity (and thus maximum current capability), it doesn't have the same highpower potential as GaN and SiC; GaN and SiC's dark leakage current limits its hold-off voltage compared to GaAs. Moreover, SiC is indirect bandgap, which means it does not absorb light as efficiently as a direct bandgap semiconductor would, and thus requires a larger laser source. It also lacks a high-gain mode, which means the laser trigger must scale directly with the current needed for a given application. As a result, it is not suitable for mobile or space and power constrained applications. However, due to its exceptional high-temperature performance, it is still a material of interest for some niche applications.

GaAs is another popular PCSS material because it has less issue with leakage current than GaN and SiC, as it does have a higher dielectric strength, while still having high withstand-voltage and short rise-times. Additionally, because it is a direct bandgap semiconductor, it is far more efficient at absorbing light near bandgap than Si or SiC, which obviates optical energy requirements. It is also one of only two materials that have displayed a high-gain, nonlinear "lock-on" mode of operation. However, GaAs was found to have a very limited lifespan at high powers due to its lack of durability, and thus isn't suited for long-service or high repetition rate applications (lasting less than 350 shots at 14.3 kV/cm and 400 A). There are methods to improve lifespan by creating more current carrying filaments, i.e. filamentation, and thus distributing the load, but these substantially increase optical energy requirements as well as delivery mechanism complexity.

Additionally, GaAs has a low optical damage threshold, making it unsuitable for ultrashort pulse systems, as the peak intensities of the laser are high enough to damage the substrate.

"Lock-on" in GaAs was first observed in 1987 by researchers at Sandia National Laboratories. This new phenomenon allowed for switching much higher currents at much lower optical input energies than the linear mode. The lock-on (so-called because the device stays switched into an "on" state after the laser pulse turns off) is characterized by a small linear response to the laser pulse, followed shortly thereafter (anywhere from 350 ps to 100 ns depending on the switch/optical trigger setup) by a large nonlinear pulse of current that lasts until the voltage across the device drops beneath the lock-on threshold. This high-gain mode is also notable for the formation of filamentary current channels across the device. The discoverers of this mode state believed that current filaments were fundamental to high-gain PCSS, and they never observed high-gain without current filaments. This observation will be of import later, as evidence of filamentation will be one of the criteria for the existence of a high-gain mode in GaN.

In this nonlinear mode, each photon generates more than one, often as many as $10^5$ electron-hole pairs, enabling tremendous current carrying capability with minimal optical input energy. However, this mode is due to bulk avalanche generation and the switch cannot be turned off until the electric field decreases below the "lock-on" threshold for a given material. While undesirable from a continuous use standpoint, this behavior is perfectly suited for pulsed applications, where large amounts of power need to be delivered in exceptionally short periods of time, and repetition rates are in the kHz at most, but higher rates are desired. The greatest benefit of this mode is the reduced optical energy required to deliver a given current. The reduction in optical energy (from mJ to nJ) greatly aids these devices from a systemic standpoint, as one of their primary drawbacks (the bulk of the laser needed to switch the device) is reduced.

This "lock-on" allows these devices to conduct large amounts of current (multiple kA) through small (0.5 cm gap) devices at 100+kV with only nJ of laser energy needed to trigger them. Unfortunately, GaAs does not exhibit good durability due to low damage thresholds both electrically and optically. At these power levels, control and design of the incoming optical trigger-such as with line emitting lasers or optical beam splitters—is necessary to achieve high currents without damaging the device. As such, GaAs in the nonlinear mode is not commercially viable or suitable for continuous operation now and may not be for years to come.

GaN has a higher photoconductive gain than other materials and has a higher volumetric heat capacity, which for high intensity pulsed power applications is critical from a system size and cooling perspective. In addition, GaN is optically triggered and exhibits low resistivity at 532 nm, a low-cost and widely commercially available laser wavelength. These aspects make it attractive for size, weight, and power (SWaP) constrained fields such as air or space-based platforms. However, to achieve low on-resistance, the optical trigger needs to be relatively high in intensity, at least partially due to the choice to operate sub-bandgap.

While GaN is attractive for pulsed power due to the superiority of its physical properties relative to GaAs and SiC, it is immature technically. Conventional GaN devices have suffered from poor performance and low yield rates due to difficulty growing and processing the bulk material. Additionally, current generation GaN PCSS devices do not exceed 250 kV/cm hold-off voltages, far short of theoretical limits, which should be greater than 2 MV/cm based on the physical properties of GaN. Recent work has been done in the field of linear PCSS devices showing that a novel PCSS architecture resolves the issue of voltage hold-off. Insulated gate PCSS, in which a traditional MISFET is used in series with the PCSS, utilizes a traditional transistor to keep the switch "off". However, by using the PCSS in series with a traditional transistor, switching frequency and current carrying capability is limited to that of the traditional device. Additionally, to date, GaN has not been shown to possess a nonlinear mode like that of GaAs or InP.

SUMMARY OF THE INVENTION

The present invention overcomes the foregoing problems and other shortcomings, drawbacks, and challenges of maximizing the current-carrying capability of a switch for a given amount of optical energy. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a photoconductive semiconductor switch (PCSS) comprises a photoconductive semiconductor block that exhibits electrically-conductive behavior when exposed to light of a predetermined wavelength; two or more electrodes fixed to the photoconductive semiconductor block and connectable to a power supply; a resonance cavity enveloping the photoconductive semiconductor block, the resonance cavity having a reflective outer surface to trap light within the resonance cavity and the photoconductive semiconductor block, the resonance cavity having a window through the reflective outer surface to admit light of the predetermined wavelength, the resonance cavity being transmissive to light of the predetermined wavelength within the reflective outer surface; and a light source directed toward the photoconductive semiconductor block and through the window, and emitting light at the predetermined wavelength.

The photoconductive semiconductor block may be one or more of Si, GaAs, GaN, AlN, SiC, $Ga_2O_3$.

The resonance cavity may be one or more of glass, crystal, Au, Ag, Cr, Ni, V, Pd, Pt, Ir, Rh, and Al.

The reflective outer surface of the resonance cavity may include one or more of Au, Ag, Al, and dielectric materials.

This switch may be a functional replacement for spark-gap switches used in pulsed-power systems, and it has more power and energy density capabilities than other PCSS variants. This switch allows for more current conduction within a given device, which has direct implications for meeting SWAP-C constraints on pulsed-power systems, such as are used in directed energy, linear accelerator, and nuclear applications.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1:
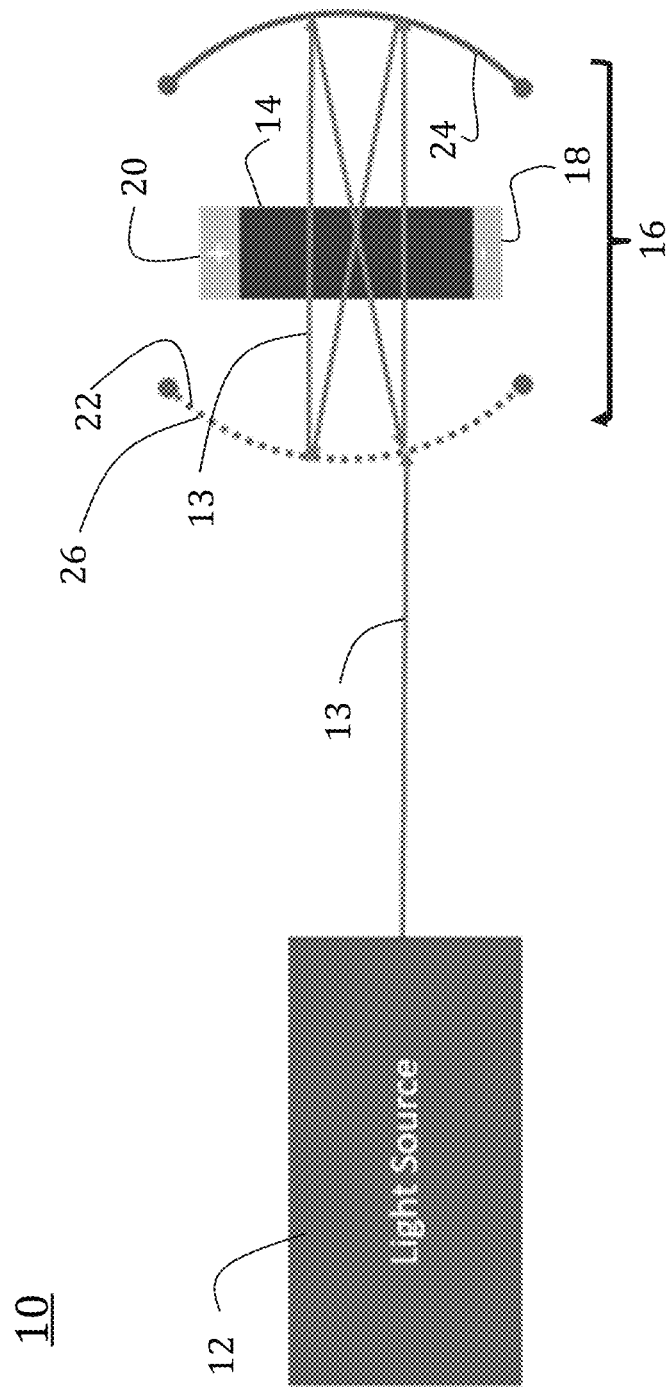
FIG. 1 depicts a sectional side view of a PCSS with a resonant cavity, according to an embodiment of the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

This inventive PCSS is designed to increase the current-carrying capability of a photoconductive semiconductor switch (PCSS) per unit of photonic energy applied, as compared to traditional methods. The PCSS enhances operation of a PCSS through the use of a resonant cavity in the linear mode via increased absorption of photonic energy from the laser pulse. This method uses a laser which is optically coupled to a resonant cavity containing a PCSS (see FIG. 1) to enhance optical absorption within the PCSS, increasing current carrying capability.

PCSSs are limited in their ability to carry current by the amount of photonic energy they absorb. In the linear mode, current conduction by a PCSS is proportional to laser energy. However, in order to achieve penetration of the bulk material of the PCSS, as well as find a viable laser source (i.e. light), a wavelength that easily penetrates the material has to be chosen; according to the prior art arrangements, much of the laser energy passes through the material without performing work. The current invention solves this problem by directing the light through the switch (PCSS) repeatedly through by the application of a resonant cavity. As a consequence, a much larger number of the photons are absorbed by the PCSS, increasing the current conduction of the device without increasing laser energy requirements.

This invention uses a suitably treated and prepared photoconductive semiconductor switch (PCSS), i.e. a material such as Si, GaAs, GaN, AlN, SiC, $Ga_2O_3$ and/or other suitable semiconductor with a pair of electrodes thereon, placed within an optically resonant cavity in the desired orientation in combination with a properly aligned and coupled laser source. The inventive PCSS may be operated in a linear, low-gain mode, turning on and off in sync with the optical trigger. In the linear mode, the laser does not need to be precisely aligned to prevent the beam from intersecting itself, as the device will not be forming filaments within the semiconductor material. Laser alignment may be modeled before final implementation to ensure optimal performance. For the non-linear mode, the laser may be aligned to make sure the beam doesn't intersect with itself as the light bounces repeatedly through the PCSS, to keep the filaments separate. This alignment may be determined and accomplished by carefully pointing and imaging the laser beam with regard to the PCSS device. For a multipass system, i.e. arrangements using an optical cavity or similar arrangement, whether linear or not, the optimal laser alignment may be modeled and simulated before implementation.

As depicted in FIG. 1, a light source 12, e.g. laser, LED, or other suitable light source, of the resonator PCSS system 10 will be aligned and optically and/or mechanically coupled to one end of the optical cavity 16 (i.e. resonant cavity). The PCSS 14 may be inserted or incorporated into the cavity 16 in whichever orientation is desired. The PCSS 14 may define the cavity 16 such that the optical cavity is formed closely around the PCSS with little or no gap between the cavity and the PCSS. See FIG. 1. Material selections for an optical cavity 16 for the PCSS system 10 may be basically anything reflective of the selected wavelength, and that won't be damaged by the laser or light source, which may be from 200-1500 nm wavelength. Such materials include glass, crystal, and polished metals, e.g. Au, Ag, Cr, Ni, V, Pt, Pd, Ir, Rh, and Al; in almost all cases these materials are treated with a highly reflective surface treatment, e.g. Au, Ag, Al, or dielectric materials, to minimize losses.

The amount of space around the PCSS 14 or between the PCSS 14 and the reflective surfaces 22, 24 of the optical chamber 16 will depend on the particular construction details desired. Optimally, the device will be as small as possible, a few mm or smaller. Of course, the overall size will be partially dependent on the size of the PCSS itself, its impact on the propagation of the light, and the geometry of the reflections. For example, the optical chamber 16 may be fabricated or grown directly onto the PCSS 14 itself. In some embodiments, the PCSS 14 may be surrounded by a material transparent to the selected laser frequency, and the outer surface of the transparent material may be coated by a material that is reflective of the selected laser frequency, e.g. gold, aluminum, silver, or a dielectric coating. Optimally, the particular wavelength of the laser 12 or light source will be compatible with the selected and desired PCSS system materials, i.e. a wavelength that is able to pass through the PCSS material and to which the PCSS material responds. The optimal wavelength/frequency is dependent on the bandgap of the particular PCSS material. The materials of the optical chamber 16 may be selected for optimal performance with the selected wavelength of the laser or light source. For example, one wall of the optical chamber 16, or a window within the wall, may be fabricated from a material transparent to the selected laser wavelength directed from an eternal light source 12 in order to admit light into the optical chamber 16 but prevents the light from escaping, e.g. a partially transmissive material, i.e. a material transparent to the wavelength in question, with a specialty coating or optic on the far side that allows the light to travel through in one direction, but not the other. Another option would be to have the mirrors set up so that the light enters through a small hole/window, but never reflects back to that spot. The remaining wall(s) are reflective 24 (see description of mirrors above) to the selected wavelength in order to trap the light within the PCSS system 10 and direct the light repeatedly through the PCSS 14. Depending upon the particular performance characteristics of the PCSS system 10, suitable materials for the PCSS 14 include Si, diamond, GaN, SiC, GaAs, AlN, and/or $Ga_2O_3$.

As is illustrated in FIG. 1, light from a light source 12, e.g. laser, having a wavelength compatible with the bulk material of the PCSS 14, is directed through a partially-transmissive wall 26 of the optical chamber 16 and into/through the PCSS 14 where the light 13 interacts with the PCSS 14. Upon penetrating the PCSS 14, the light 13 impinges on the reflective surface 24 of the wall of the optical chamber 16 opposite the PCSS 14 from the point of entry and is reflected back into/through the PCSS 14 in a continuous cycle until the photons either are expended in the PCSS system 10 or escape. The internal shape of the optical chamber 16 and its reflective surfaces 22, 24 may be designed to guarantee that the light 13 from the laser source 12 passes through the PCSS 14 a minimum number of times before it escapes or is expended. This may be enhanced by careful aiming of the coupled light source 12. The electrodes 18, 20 may be connected to a power or high-voltage source as desired. The PCSS system 10 acts as an insulator or switch until the PCSS 14 is struck by the light 13, at which time it becomes a conductor with a very fast response time.

Orientation of the PCSS 14 within the system 10 is mostly a packaging question and depends on the performance objectives. From the perspective of leveraging bulk material properties of the PCSS 14, it is desirable for the current to pass between the electrodes 18, 20 and through the vertical aspect of the device of FIG. 1, so as to pass the current through the length of the bulk material of the PCSS 14. The vertical arrangement of FIG. 1 is desirable in order to avoid surface current, and to more-efficiently leverage the bulk material properties of the PCSS 14.

Figure 5:
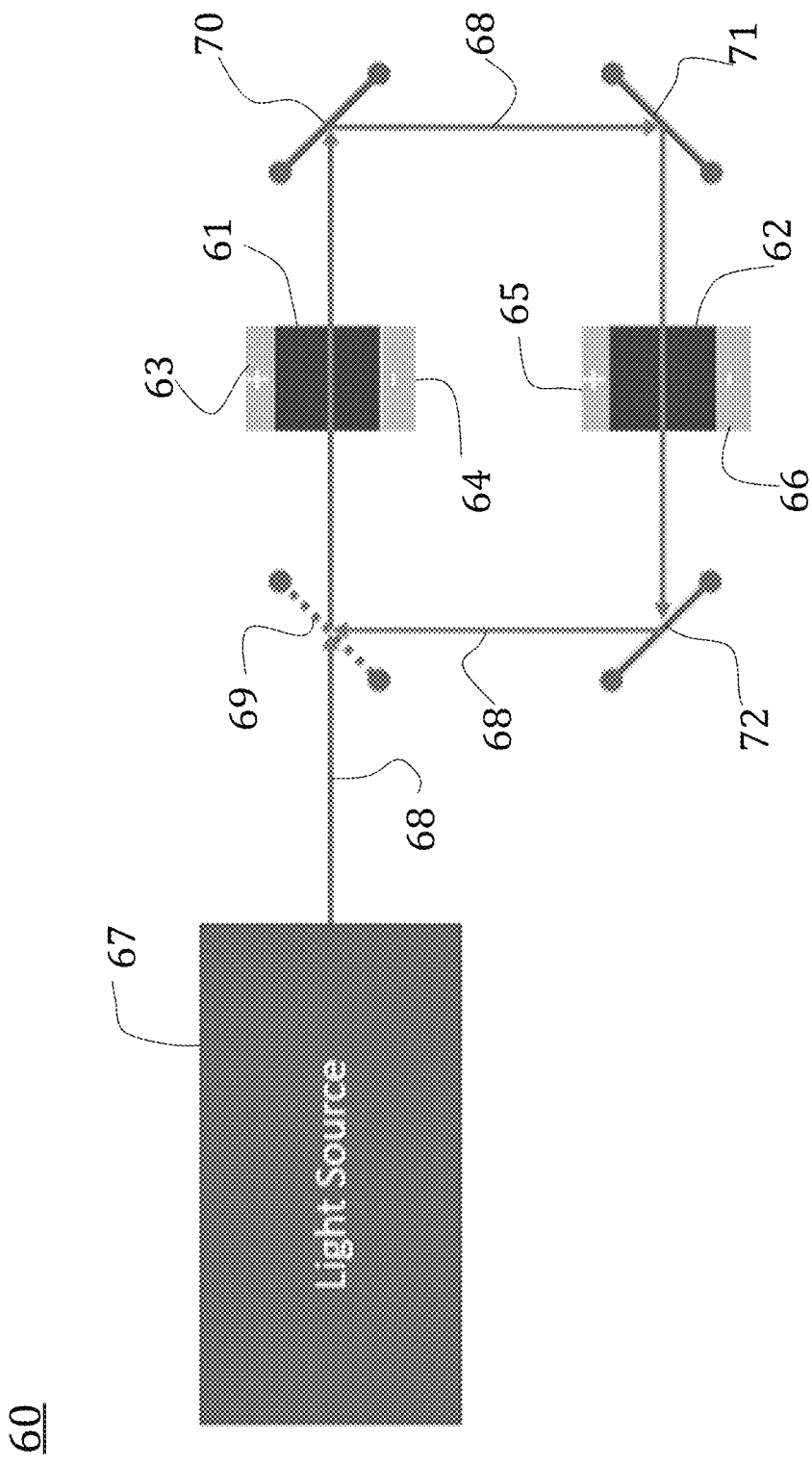
FIG. 5 illustrates a ring cavity comprising multiple PCSS devices, according to an embodiment of the invention.

As illustrated in FIG. 1, mirrors may be generally arranged opposing each other, with one mirror being partially reflective and the other fully reflective; a partially reflective mirror allows light to be injected into the cavity. Other arrangements for injecting and directing light through bulk PCSS 14 material are depicted in FIGS. 5-6.

Short pulse lasers are useful, 200 ps-10 ns pulse widths, for example. Diode lasers are particularly useful because of their small form factor.

A preferred embodiment is as shown in FIG. 1. However, multiple orientations of the PCSS are possible, as are different resonator configurations depending on what the user of the invention desires. Typically, a single material may be used as the 'active' material of the PCSS, e.g. GaAs. However, the single material may be doped to provide the desired performance characteristics, or additional materials may be used to provide substrate layers or for insulation. For example, GaN may be doped with carbon, Mn, Mg, and/or Fe; SiC may be doped with vanadium. Wavelength and energy of the light source are important to consider. The longer the wavelength, the lower the energy. It is recommended to select a wavelength close to the bandgap of the material to most effectively be absorbed in the PCSS 14 and knock off electrons. The wider the bandgap of the material, the shorter the wavelength that matches that bandgap is. The formula is given as $\lambda = h \cdot c / E$, where lambda is the wavelength, h is Planck's constant, c is the speed of light, and E is the bandgap of the material in question.

For example, 3.65 eV bandgap translates to 340 nm wavelength.

Fabrication of the PSCC system was accomplished by attaching planar electrodes onto a GaN substrate using standard photolithography, electron-beam metal evaporation, and metal-liftoff techniques. The electrical contact, consisting of a Ti/Al/Ni/Au metal stack, was then annealed at 800° C. for 1 min in a rapid-thermal annealing system to promote adhesion of the electrical contact metals. Using similar techniques, a Ti/Au bond pad, for electrical probing and package wire-bonding, was formed on the original contact metals. Finally, the devices were singulated into dies using a dicing saw for packaging and device characterization.

Figure 2:
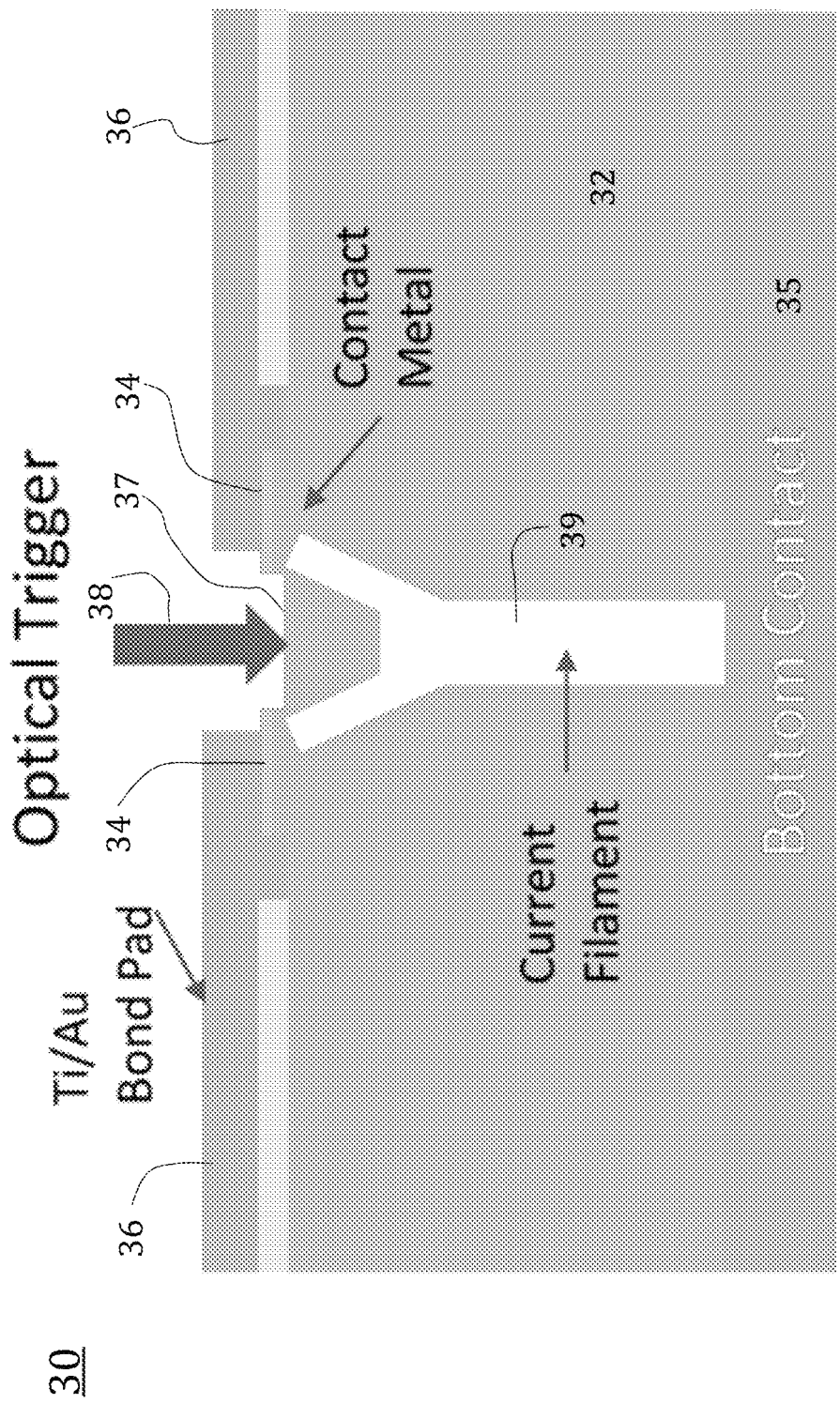
FIG. 2 illustrates a PCSS optical trigger, according to an embodiment of the invention.

FIG. 2 illustrates an exemplary optical trigger 30 utilizing a PCSS device. The trigger may include a bulk semiconductor material 32, e.g. GaN, SiC, GaAs, AlN, and/or $Ga_2O_3$, between a pair of electrical contacts 34, 35. One or both of the electrical contacts 34, 35 may have a bond pad, e.g. Ti, Au, Ag, Ni, etc. for attaching the trigger 30 into another device. The upper contact 34 and bond pad 36 may include a window 37 to permit access for a laser beam 38 or other light source to enter the semiconductor material 32. As is depicted in FIG. 2, penetration of the light 38 into the semiconductor 32 creates a current filament 39 in the bulk material 32 so that the bulk material 32 is able to conduct current between the electrical contacts 34, 35. The current filament 39 typically remains in the bulk semiconductor material 32 until shortly after the light 38 is turned off.

Figure 3:
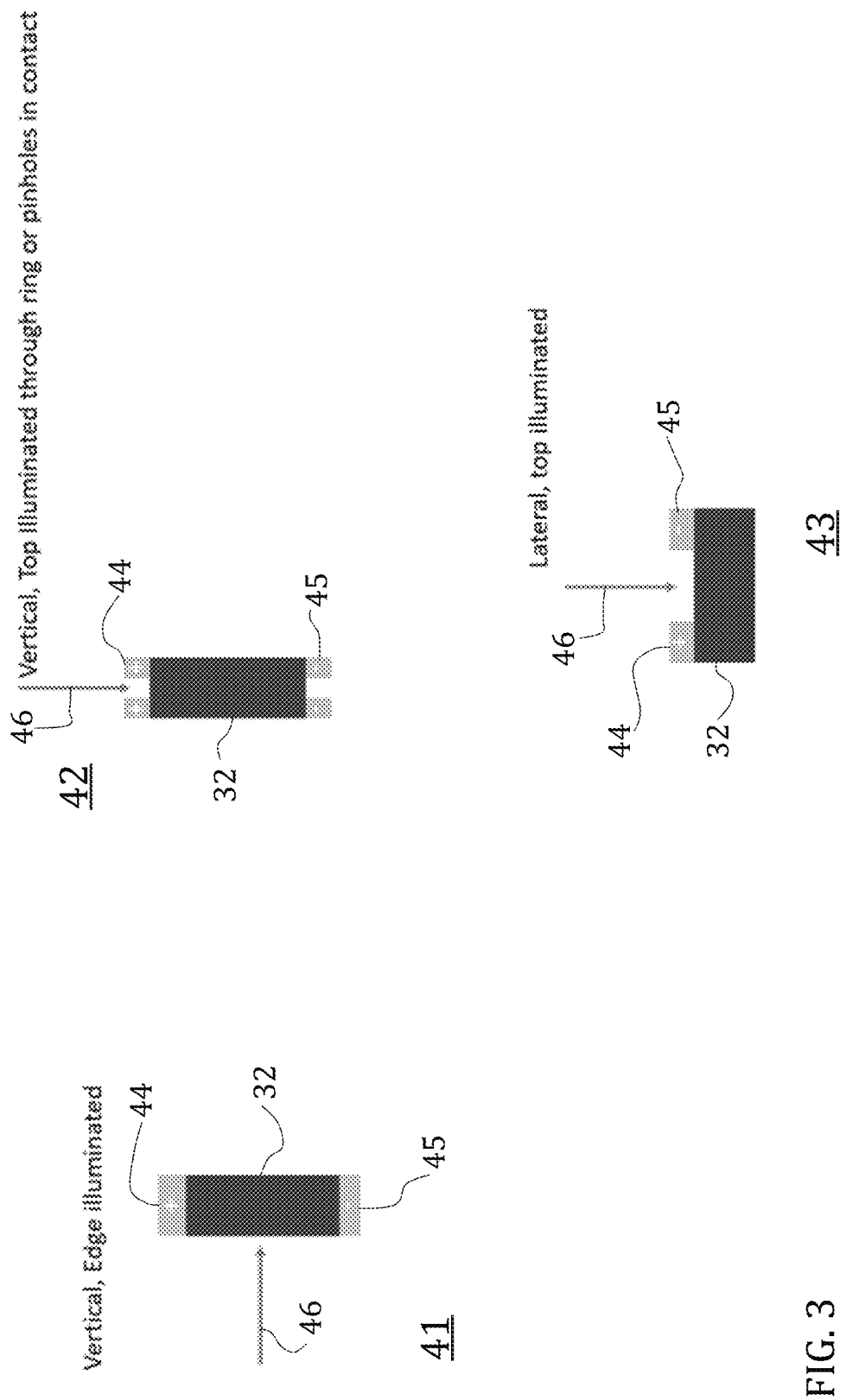
FIG. 3 illustrates vertical and lateral PCSS devices, according to embodiments of the invention.

FIG. 3 illustrates vertical 41, 42 and lateral 43 embodiments of the PCSS device. These devices are constructed using the same materials and components as described with regard to the device of FIG. 2. However, the orientations of the bulk semiconductor material 32 with regard to the electrical contacts 44, 45 and light source 46 are distinct. In each of these examples 41, 42, 43, the bulk semiconductor material 32 has an aspect ratio providing a length that is longer than its width. For example, the first vertical device 41 includes electrical contacts 44, 45 at each end of its length so that the longest dimension of the bulk material 32 is between the electrical contacts 44, 45. This forces the electric current between the contacts 44, 45 to travel though the entire length of the bulk material 32. Light from a laser or another suitable light source 46 enters the bulk material 32 through the side of the device 41. Advantageously, vertical devices have no air path between the contacts 44, 45, and are less likely to short or arc.

In the second vertical device 42 of FIG. 3, the device 42 includes electrical contacts 44, 45 at each end of its length so that the longest dimension of the bulk material 32 is between the electrical contacts 44, 45. This forces the electric current between the contacts 44, 45 to travel though the entire length of the bulk material 32. One or both of the electrical contacts 44, 45 includes a window through which a laser or other suitable light source 46 enters the bulk material 32 through an end of the device 42.

In the third embodiment of the FIG. 3, a lateral device 43 includes electrical contacts 44, 45 spaced apart on the same face of the bulk material 32, making it more compact than the vertical embodiments 41, 42. However, unlike the vertical arrangements 41, 42, the longest dimension of the bulk material 32 is not between the electrical contacts 44, 45. Under some conditions, this lateral arrangement allows the electric current between the contacts 44, 45 to travel at the surface of the bulk material 32; lateral devices exhibit a greater risk of shorting or arcing. Light from a laser or another suitable light source 46 may enter the bulk material 32 through the side of the device, such as between the electrical contacts.

The bulk material properties of GaN and SiC may be particularly useful in PCSS devices and other high power applications, because they can hold off more voltage across a smaller and faster device. Additionally, they perform better at high temperatures, meaning they need less cooling and may be used in more extreme environments. Leveraging these bulk material properties is also why it may be desirable to use vertical, rather than lateral devices (see FIG. 3). Things may become unpredictable at boundaries, where multiple elements meet. For example, on a lateral device, there is a boundary where the bulk of the switch, the metal of the contact, and the dielectric surrounding the pair all meet. These 'triple points' are notoriously difficult to model, and exhibit odd and difficult-to-predict properties. A lot of field enhancement effects. Accordingly, it may be helpful to avoid having the primary current path be on the surface of the device like it would be in a lateral device 43. The vertical arrangement also helps in avoiding arcing between electrodes at higher voltages.

Figure 4:
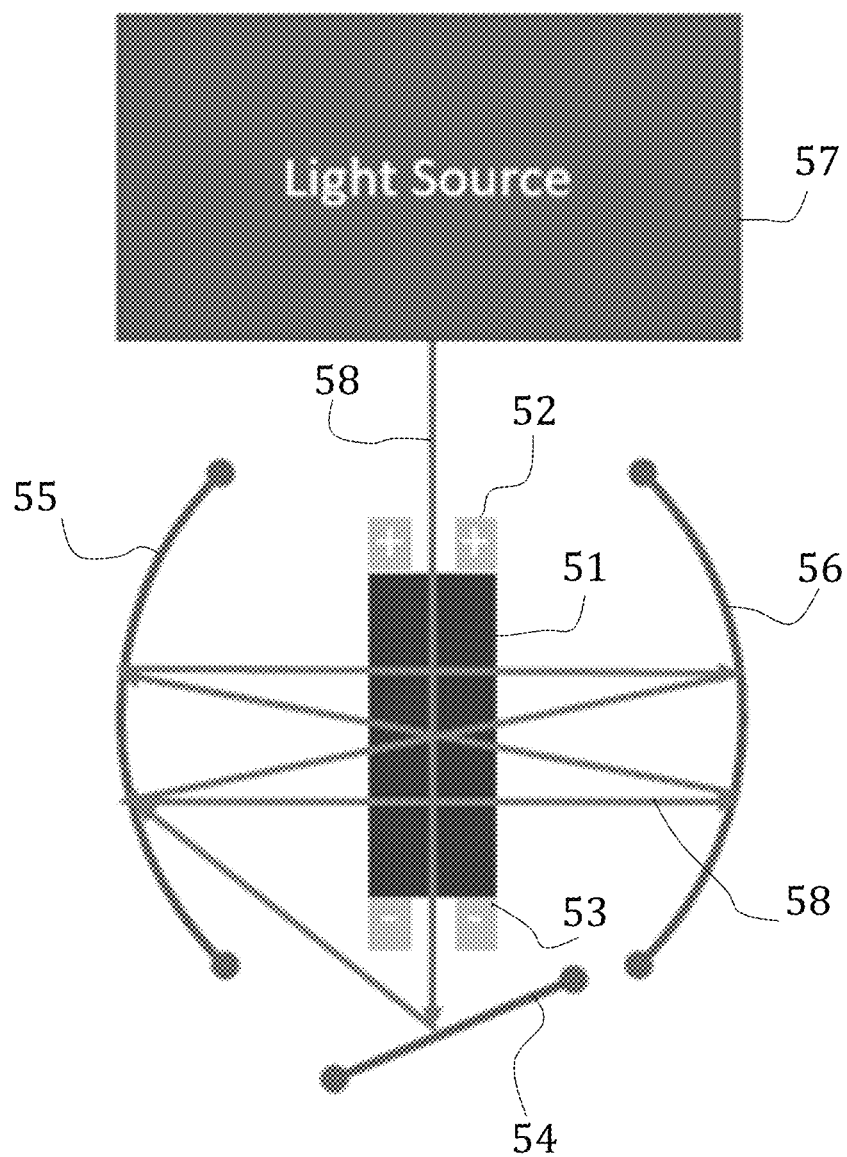
FIG. 4 illustrates a three-mirror PCSS device, according to an embodiment of the invention.

Contact Materials, i.e. for electrical contact 34, 35, 44, 45 with the PCSS bulk material 14, 32, may include any conductive materials that exhibit good adhesion to the chosen PCSS and insulator. The insulator would be a separate, non-conductive material applied to the surface of the PCSS to prevent unwanted electrical activity. However, depending on the device, operating voltages, geometries, etc, it may not be needed. None of the figures shown are depicted with an insulating layer, but if desired, the insulating material is generally applied to the device where there are no contacts. FIGS. 4 and 5 illustrate additional embodiments of PCSS devices utilizing optical resonance. FIG. 4 depicts a three-mirror arrangement 50. More than three mirrors may be used in order to meet performance objectives. The PCSS bulk material 51 having electrical contacts 52, 53 is placed within an optical chamber defined by three mirrors 54, 55, 56. The light source 57, e.g. laser, LED, or other suitable light source directs a beam 58 into and through the PCSS material 51 onto a first mirror 54. The first mirror 54 reflects the beam 58 to a second mirror 55 which reflects the beam 58 to a third mirror 56 for continued reflection between the second and third mirrors and through the PCSS material 51. FIG. 5 depicts a multiple-mirror arrangement 60 having two PCSS devices 61, 62, with each PCSS device 61, 62 connectable to a voltage or power source at electrical contacts 63, 64, 65, 66. A light source, e.g. a laser, LED or other suitable source, directs a beam 68 through a partially-transmissive mirror 69 and through the first PCSS device 61. A number of mirrors 69, 70, 71, 72 are arranged to for a circuit to activate both switches 61, 62 sequentially. The beam 68 is reflected from mirror to mirror 69-72 and through each PCSS device 61, 62. The partially-transmissive mirror 69 allows the injection of light beam 68 into the device 60. The timing of the two-switch circuit, e.g. the operation of one switch 61 with respect to the other switch 62, may be adjusted by changing the distance between the mirrors or the path of the beam 68.

The novel PCSS arrangement described herein may be useful for high-voltage (>1200 kV) switching, high-amperage (>100 A) switching, ultra-fast (>1 MHz) switching, ultra-short pulse (<1 ns) switching, DC circuit protection, EMP/EMI generation, RF generation, particle beam generation, and transistor replacement.

The invention may be used as a replacement for spark gap and conventional transistor switches in high-voltage applications. When it is desired that the invention conduct current, a signal to turn on the optical source (i.e. laser, LED, or other suitable light) is sent. The signal may be sent from a control circuit or may be manually triggered. When the photons from the optical source impact the PCSS, the PCSS turns from an "off" state into a conductive "on" state according to the physical mechanisms describe above. Depending on the mode of operation of the PCSS, it will either conduct electricity until the voltage supplied to it drops below a certain level, or it will stop conducting when the optical source is turned off.

Alternative Embodiments and Materials

Multiple wide bandgap semiconductors may be used for the PCSS in the invention, including but not limited to GaAs, GaN, and AlN. All of these materials exhibit both linear and non-linear modes of operation. A variety of optical sources can be used, as long as they provide enough energy at the correct wavelength for a given material, e.g. fiber, dye, semiconductor, diode, gas). In addition, even an LED may be used, provided that it is at the right wavelength and emits enough energy. GaAs exhibits diminished durability compared to GaN or AlN, however, it may be a great choice for disposable or limited-life switches.

Instead of an optical chamber, the PCSS may be treated and designed to exhibit total internal reflection. However, this makes the manufacture and alignment of the device much more demanding, and thus costly. Effectively, each side of the PCSS will need to be polished or etched, and applying a reflective coating. Alternatively, a similar effect may be achieved by growing layers of a material with the correct index of refraction around the PCSS.

This device may also be used to provide "hardening" to an electronic system, reducing its electromagnetic susceptibility when used in place of a traditional transistor.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

This invention is useful in the directed energy, pulsed power, medical, and high energy physics fields. It may also be used in electrical power conversion (AC/DC or DC/DC) and isolation.

Previous methods of increasing current carrying capability have required using more powerful optical trigger sources, multiple optical trigger sources, or complex optical systems, all of which carry significant drawbacks from a system size and complexity standpoint. A resonant cavity in combination with a PCSS is a new approach.

The invention allows for increased current carrying capacity in comparison to the current state of the art in PCSS. It the first use of a resonant cavity to optimize PCSS performance. This invention enables more-complete absorption of laser energy within the PCSS, greatly increasing the efficiency of the device, as well as its functionality. While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A photoconductive semiconductor switch (PCSS) comprising:
   a photoconductive semiconductor block that exhibits electrically-conductive behavior when exposed to light of a predetermined wavelength, wherein the photoconductive semiconductor block is one or more of Si, AlN, SiC, $Ga_2O_3$;
   two or more electrodes fixed to the photoconductive semiconductor block and connectable to a power supply;
   a resonance cavity enveloping the photoconductive semiconductor block, the resonance cavity having a reflective outer surface to trap light within the resonance cavity and the photoconductive semiconductor block, the resonance cavity having a window through the reflective outer surface to admit light of the predetermined wavelength, the resonance cavity being transmissive to light of the predetermined wavelength within the reflective outer surface, wherein the resonance cavity comprises one or more of glass, Au, Ag, Cr, Ni, V, Pd, Pt, Ir, and Rh; and
   a light source directed toward the photoconductive semiconductor block and through the window, and emitting light at the predetermined wavelength.

2. The photoconductive semiconductor switch (PCSS) of claim 1, wherein the reflective outer surface of the resonance cavity comprises one or more of Au, Ag, Al, and dielectric materials.

* * * * *